(12) United States Patent
Kodama et al.

(10) Patent No.: US 11,839,923 B2
(45) Date of Patent: Dec. 12, 2023

(54) COATED TOOL, CUTTING TOOL, AND METHOD FOR MANUFACTURING MACHINED PRODUCT

(71) Applicant: KYOCERA CORPORATION, Kyoto (JP)

(72) Inventors: Yoshikazu Kodama, Nobeoka (JP); Tadashi Katsuma, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 706 days.

(21) Appl. No.: 16/624,915

(22) PCT Filed: Jun. 18, 2018

(86) PCT No.: PCT/JP2018/023114
§ 371 (c)(1),
(2) Date: Dec. 20, 2019

(87) PCT Pub. No.: WO2018/235775
PCT Pub. Date: Dec. 27, 2018

(65) Prior Publication Data
US 2021/0031280 A1 Feb. 4, 2021

(30) Foreign Application Priority Data
Jun. 21, 2017 (JP) .................. 2017-121283

(51) Int. Cl.
*B23B 27/14* (2006.01)
*B23C 5/20* (2006.01)

(52) U.S. Cl.
CPC .............. *B23C 5/202* (2013.01); *B23B 27/14* (2013.01); *B23B 27/148* (2013.01); *B23B 2228/10* (2013.01); *B23C 2226/27* (2013.01)

(58) Field of Classification Search
CPC ..... B23B 27/00; B23B 27/145; B23B 27/146; B23B 27/148; B23B 2228/00;
(Continued)

(56) References Cited

U.S. PATENT DOCUMENTS 4,629,373 A * 12/1986 Hall ...................... B23B 27/146
428/408
5,669,271 A * 9/1997 Griffin ................. C23C 30/005
175/428
(Continued)

FOREIGN PATENT DOCUMENTS

CN 104085142 A * 10/2014
EP 860515 A1 * 8/1998 ........... B23B 27/146
(Continued)

OTHER PUBLICATIONS

CN-104085142-A Machine Translation (Year: 2022).*

*Primary Examiner* — Nicole N Ramos
(74) *Attorney, Agent, or Firm* — VIERING, JENTSCHURA & PARTNER MBB

(57) ABSTRACT

A coated tool may include a base member having a first surface and a coating layer located on the first surface. The coating layer may have a first layer and a second layer. The first layer may be located on the first surface, and the first layer may include aluminum oxide. The second layer may be contactedly located on the first layer, and the second layer may include a titanium compound. In a cross section orthogonal to the first surface, the first layer may include a first projection protruding toward the second layer and a first recess located on the first projection. The second layer may include a second recess engaged with the first projection and a second projection engaged with the first recess.

18 Claims, 10 Drawing Sheets

(58) Field of Classification Search
CPC .......... B23B 2228/10; B23B 2228/105; B23C 2228/00; B23C 2228/10
See application file for complete search history.

(56) References Cited

U.S. PATENT DOCUMENTS

| | | | | |
|---|---|---|---|---|
| 5,711,702 | A * | 1/1998 | Devlin | B24D 99/00 175/428 |
| 6,106,585 | A * | 8/2000 | Packer | C04B 35/645 264/642 |
| 6,187,421 | B1 * | 2/2001 | Moriguchi | C23C 28/044 51/307 |
| 6,251,508 | B1 * | 6/2001 | Ruppi | C23C 30/005 428/323 |
| 6,508,150 | B1 * | 1/2003 | Bertschinger | B23B 27/145 407/119 |
| 6,756,111 | B1 | 6/2004 | Okada et al. | |
| 6,892,836 | B1 * | 5/2005 | Eyre | E21B 10/5735 175/426 |
| 7,172,807 | B2 * | 2/2007 | Fukano | C23C 30/005 51/307 |
| 7,396,371 | B2 * | 7/2008 | Cedergren | C23C 16/00 51/307 |
| 9,228,258 | B2 * | 1/2016 | Fukunaga | C23C 28/044 |
| 2003/0235677 | A1 * | 12/2003 | Hanschen | B29C 37/0067 428/156 |
| 2003/0235678 | A1 * | 12/2003 | Graham | B41M 5/502 428/156 |
| 2010/0166512 | A1 * | 7/2010 | Tanibuchi | C23C 16/36 427/255.15 |
| 2012/0183364 | A1 * | 7/2012 | Harden | B22F 7/06 407/115 |
| 2012/0222364 | A1 * | 9/2012 | Lyons | E21B 10/5735 51/296 |
| 2012/0225247 | A1 | 9/2012 | Sone | |
| 2017/0216927 | A1 * | 8/2017 | Yoshida | B23B 27/146 |

FOREIGN PATENT DOCUMENTS

| | | | | |
|---|---|---|---|---|
| GB | 2316698 | A * | 3/1998 | .......... B23B 27/146 |
| JP | H09267201 | A | 10/1997 | |
| JP | 2004351548 | A | 12/2004 | |
| JP | 2009166216 | A | 7/2009 | |
| WO | 0079022 | A1 | 12/2000 | |
| WO | WO-2008105519 | A1 * | 9/2008 | .......... B23B 27/146 |
| WO | WO-2011018917 | A1 * | 2/2011 | .......... B23B 27/146 |
| WO | 2011055813 | A1 | 5/2011 | |
| WO | WO-2016121690 | A1 * | 8/2016 | .......... B23B 27/146 |

* cited by examiner

COATED TOOL, CUTTING TOOL, AND METHOD FOR MANUFACTURING MACHINED PRODUCT

CROSS-REFERENCE TO RELATED APPLICATIONS

The present application is a national stage entry according to 35 U.S.C. § 371 of PCT application No.: PCT/JP2018/023114 filed on Jun. 18, 2018; which claims priority to Japanese Patent Application Serial No.: 2017-121283, which was filed on Jun. 21, 2017; both of which are incorporated herein by reference in their entirety and for all purposes.

TECHNICAL FIELD

The present embodiment relates to a coated tool for use in a cutting process.

BACKGROUND

As a coated tool for use in a cutting process, such as a turning process and a milling process, a coated tool described, for example, in Japanese Unexamined Patent Publication No. 2009-166216 (Patent Document 1) has been known. The coated tool described in Patent Document 1 includes a configuration in which a coating layer is located on a surface of a base member composed of cemented carbide or the like. The coating layer includes a layer (multilayer coating) including a compound of titanium (Ti) or the like, a layer (binding layer) including a compound of titanium, and a layer ($\alpha$-type aluminum oxide layer) including $\alpha$-type aluminum oxide ($\alpha$-$Al_2O_3$).

In the coated tool described in Patent Document 1, the surface of the binding layer has a dendrite shape consisting of a tree-like protrusion and a branch-like protrusion. It is described that since the binding layer has a dendrite shape, the adhesion between the binding layer and the $\alpha$-type aluminum oxide layer is enhanced by an anchor effect.

However, the coated tool described in Patent Document 1 includes a configuration in which both the tree-like protrusion and the branch-like protrusion protrude from the binding layer toward the $\alpha$-type aluminum oxide layer. In a case where the coating layer includes such configuration, both the load due to the tree-like protrusion and the load due to the branch-like protrusion that are caused by the anchor effect are added to the $\alpha$-type aluminum oxide layer. Therefore, the durability of the coating layer may be lowered.

SUMMARY

A coated tool in one embodiment includes a base member including a first surface and a coating layer located on the first surface. The coating layer includes a first layer and a second layer. The first layer is located on the first surface and includes aluminum oxide. The second layer is contactedly located on the first layer and includes a titanium compound. In a cross section orthogonal to the first surface, the first layer includes a first projection protruding toward the second layer and a first recess located on the first projection, and the second layer includes a second recess engaged with the first projection and a second projection engaged with the first recess.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1:
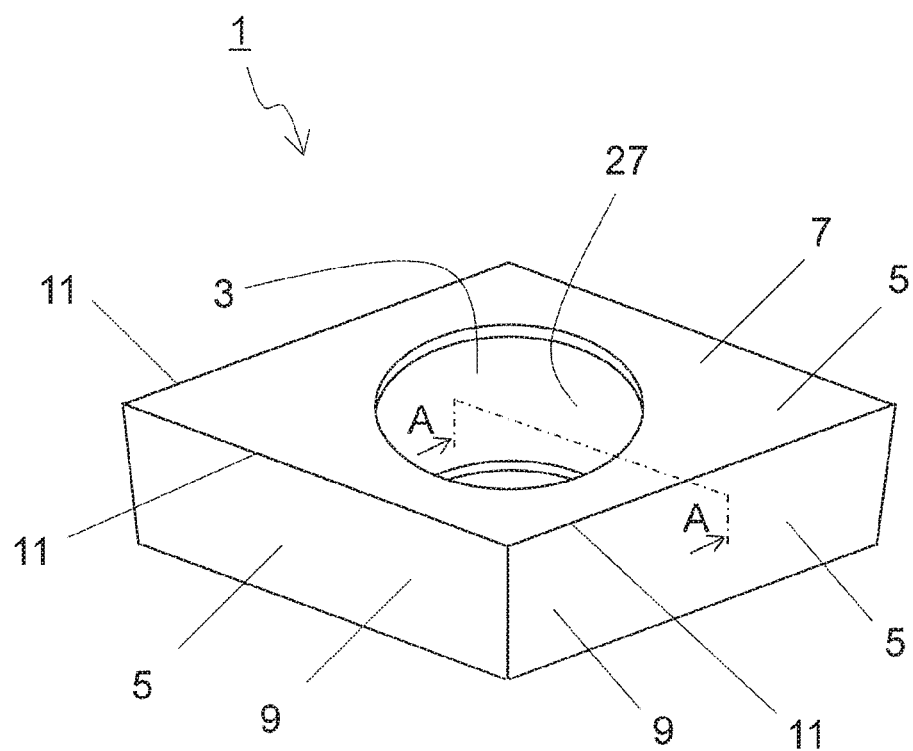
FIG. 1 is a perspective view illustrating a coated tool in an embodiment.

A coated tool 1 in the embodiment is described in detail below with reference to the drawings. For the sake of description, the drawings referred to in the following illustrate, in a simplified form, only main members necessary for describing the embodiment below. The coated tool 1 is therefore capable of including any arbitrary structural member not illustrated in the drawings referred to. Sizes of the members in each of the drawings faithfully represent neither sizes of actual structural members nor size ratios of these members.

<Coated Tool>

Figure 2:
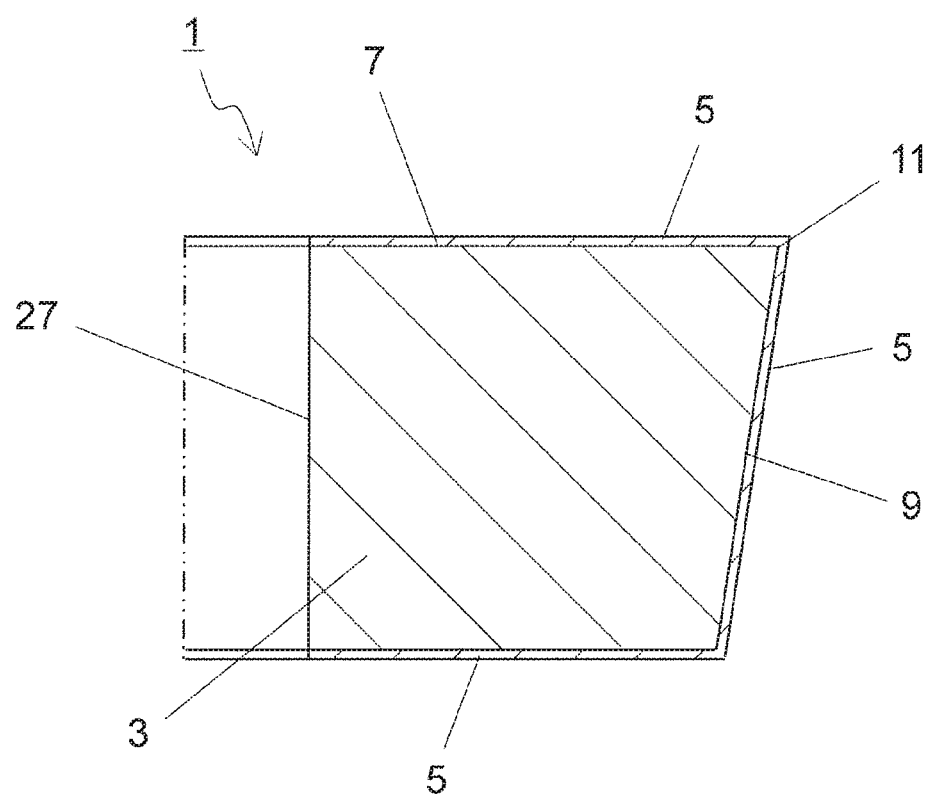
FIG. 2 is a sectional view taken along line A-A in the coated tool illustrated in FIG. 1.

The coated tool 1 of the embodiment includes a base member 3 and a coating layer 5 as illustrated in FIGS. 1 and 2. The base member 3 includes a first surface 7 (an upper surface in FIG. 2), a second surface 9 adjacent to the first surface 7 (a side surface in FIG. 2), and a cutting edge 11 located at least on a part of a ridge line where the first surface 7 intersects with the second surface 9 in the example illustrated in FIG. 2.

The base member 3 has a quadrangular plate shape, and the first surface 7 has a quadrangular shape in the example illustrated in FIG. 1. The number of the second surfaces 9 is therefore four. At least a part of the first surface 7 is a rake surface region, and at least a part of the second surface 9 is a flank surface region in the coated tool 1 of the example. The shape of the base member 3 is not limited to the quadrangular plate shape. For example, the first surface 7 may include a triangular, pentagonal or hexagon shape. Alternatively, the base member 3 may have a columnar shape besides the plate shape.

The coating layer 5 is located at least on the first surface 7 of the base member 3. The coating layer 5 may be located only on the first surface 7 or on a surface other than the first surface 7 in the base member 3. The coating layer 5 is also located on the second surface 9 in addition to the first surface 7 in the coated tool 1 of the example. The coating layer 5 is included for the purpose of improving characteristics of the coated tool 1 during a cutting process, such as wear resistance and chipping resistance.

Figure 3:
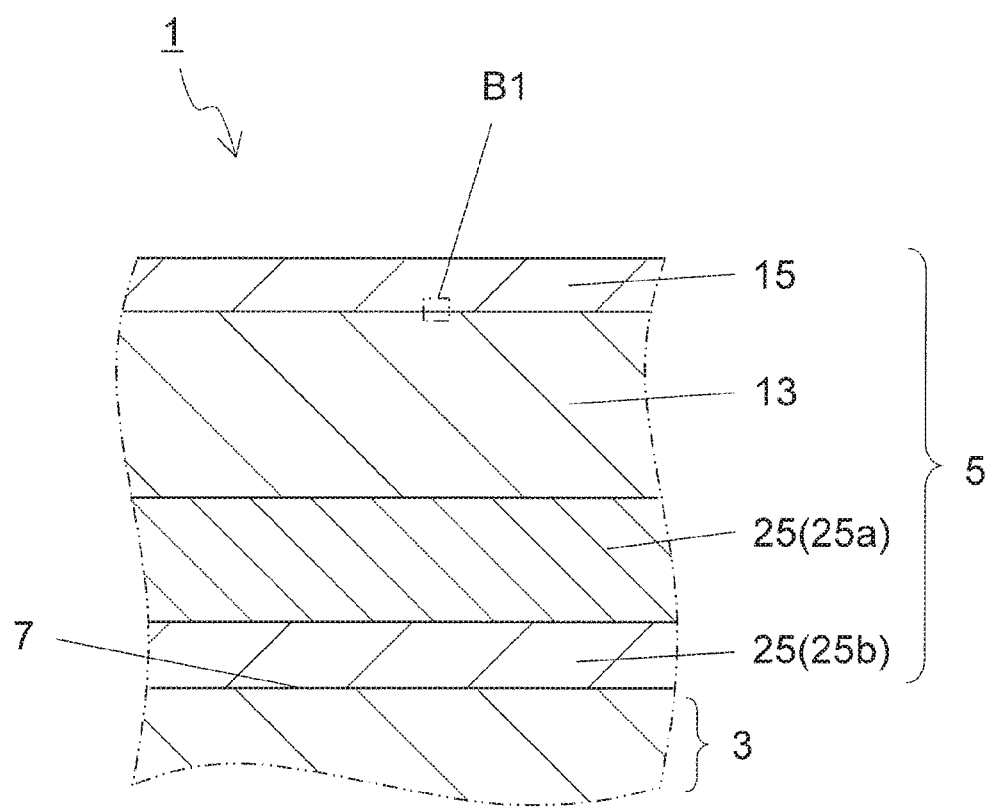
FIG. 3 is an enlarged view in the vicinity of a coating layer in the coated tool illustrated in FIG. 2.

The coating layer 5 includes a first layer 13 and a second layer 15 in the example as illustrated in FIG. 3. The first layer 13 is located on the first surface 7 and includes aluminum oxide ($Al_2O_3$). The second layer 15 is contactedly located on the first layer 13 and includes a titanium compound.

The first layer 13 may include aluminum oxide as a main component. The second layer 15 may include a titanium compound as a main component. The term "main component" indicates a component having a largest value in mass % among values of other components.

The first layer 13 may include a component other than the aluminum oxide, and the second layer 15 may include a component other than the titanium compound. For example, joinability between the first layer 13 and the second layer 15 is improved if the first layer 13 includes the titanium compound. In addition, joinability between the first layer 13 and the second layer 15 is improved also if the second layer 15 includes the aluminum oxide.

Examples of the aluminum oxide included in the first layer 13 include α-alumina (α-$Al_2O_3$), γ-alumina (γ-$Al_2O_3$), and κ-alumina (κ-$Al_2O_3$). If the first layer 13 includes the largest amount of α-alumina of these, heat resistance of the coated tool 1 is high. The first layer 13 may include only one of the above compounds or, alternatively, may include a plurality of kinds of the above compounds.

Identification of the aluminum oxide included in the first layer 13 from among the above compounds can be evaluated, for example, by carrying out X-ray diffraction (XRD) analysis and by matching the JCPDS card.

The α-alumina, γ-alumina, and κ-alumina may be included in the first layer 13 in any state, for example, they may be included in the first layer 13 in a state of a plurality of columnar crystals 13a individually extending from the base member 3 side toward the second layer 15.

Examples of the titanium compound included in the second layer 15 include titanium carbide, nitride, oxide, carbonitride, carbon oxide, and oxycarbonitride. The second layer 15 may be configured to include only one of the above compounds or, alternatively, may be configured to include a plurality of kinds of the above compounds.

A boundary between the first layer 13 and the second layer 15 can be determined, for example, by observing a scanning electron microscope (SEM) photograph or a transmission electron microscope (TEM) photograph.

Figure 4:
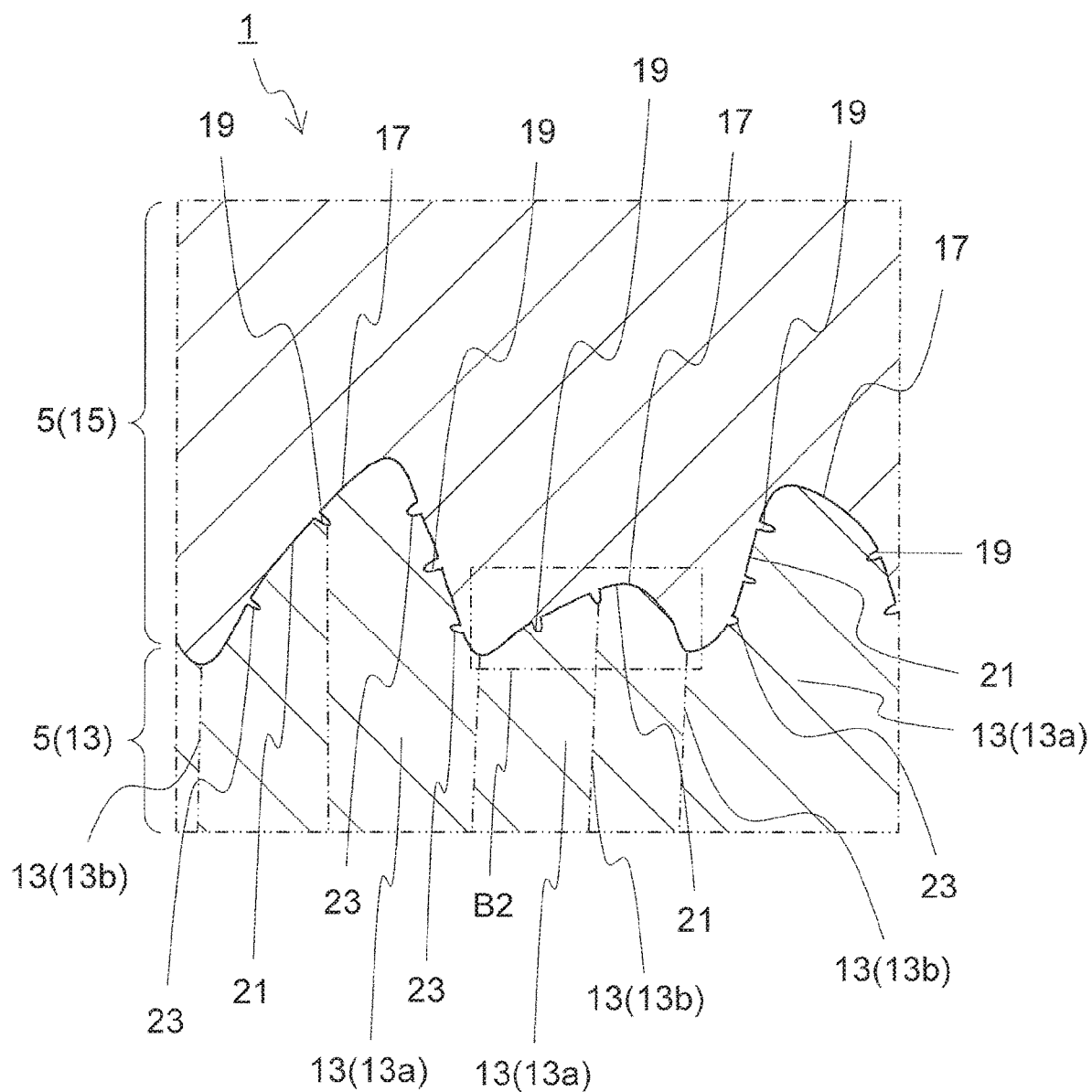
FIG. 4 is an enlarged view of a region B1 illustrated in FIG. 3.

When the coating layer 5 is observed in a cross section orthogonal to the first surface 7, the first layer 13 includes a first projection 17 and a first recess 19 on an interface on the side to be bonded to the second layer 15 (an interface on the upper side of FIG. 4) where the first projection 17 protrudes toward the second layer 15 and the first recess 19 is located on the first projection 17 in the example illustrated in FIG. 4. The second layer 15 includes a second recess 21 and a second projection 23 on an interface on the side to be bonded to the first layer 13 (an interface on the lower side of FIG. 4) where the second recess 21 is engaged with the first projection 17 and the second projection 23 is engaged to the first recess 19.

Figure 5:
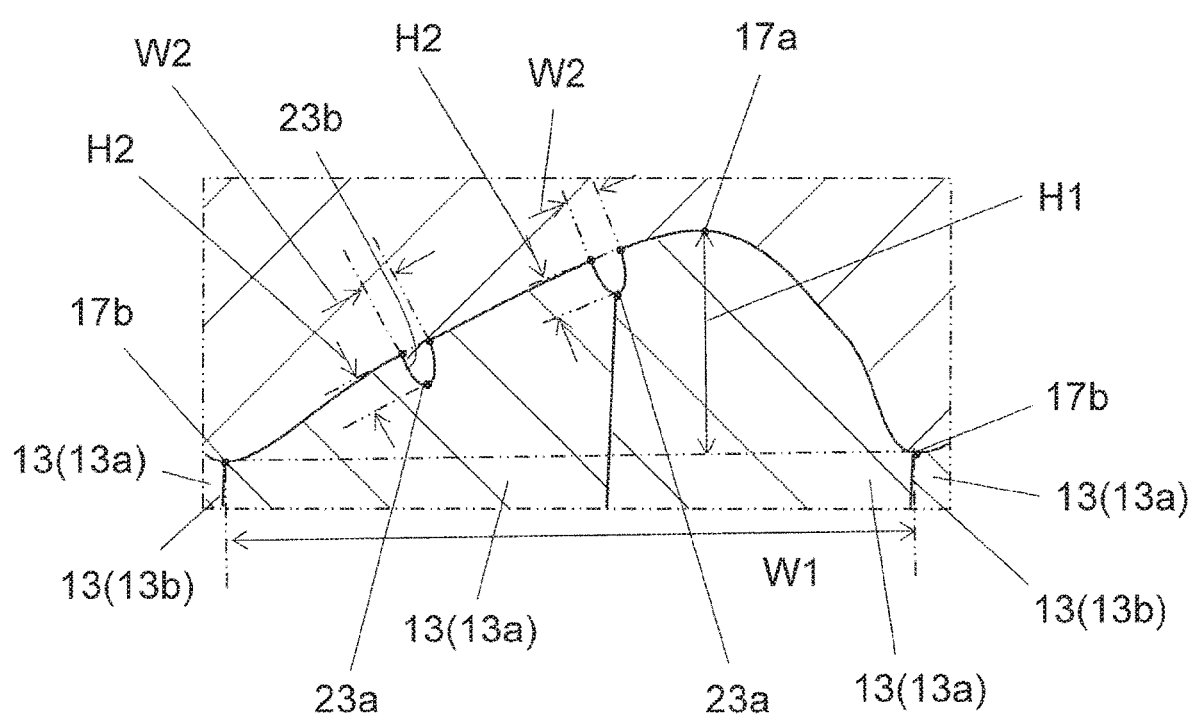
FIG. 5 is an enlarged view of a region B2 illustrated in FIG. 4.

In the coating layer 5 in the example illustrated in FIGS. 4 and 5, the first projection 17 protrudes toward the second layer 15, and the second projection 23 protrudes toward the first layer 13. Therefore, due to the anchor effect, the first projection 17 has a high joinability to the second layer 15, and the second projection 23 has a high joinability to the first layer 13.

Since the first layer 13 includes the first projection 17 and the second layer 15 includes the second projection 23, the load caused by the anchor effect is hardly biased to only one of the first layer 13 and the second layer 15. Therefore, the coated tool 1 provided with the coating layer 5 has high joinability due to the anchor effect and high durability.

The sizes of the first projection 17 and the second projection 23 are not limited to specific numerical values. Where Rz is a maximum height of the interface of the first surface 7 located on the side of the second surface 9, for example, in the cross section orthogonal to the first surface 7, the height of the first projection 17 may be set to equal to or more than Rz/10 and the height of the second projection 23 may be set to less than Rz/10.

In the following description, the length of a first imaginary straight line connecting a pair of base ends of the projection when viewed in cross section is defined as a width W of the projection, as shown in FIG. 5. The length of a second imaginary straight line orthogonal to the first imaginary straight line and passing through the first imaginary straight line and the top of the projection is defined as a height H of the projection.

Since the second projection 23 is engaged to the first recess 19 and the first recess 19 is located on the first projection 17, the first projection 17 is larger than the second projection 23 in the coated tool 1 of the example. Specifically, a width W1 of the first projection 17 is larger than a width W2 of the second projection 23, and a height H1 of the first projection 17 is larger than a height H2 of the second projection 23. Due to this, the durability of the coated tool 1 is high.

Since the first projection 17 is larger than the second projection 23, the load due to the anchor effect is applied to the second recess 21 more than to the first recess 19. At this time, second layer 15 is contactedly located on the first layer 13. Therefore, even if a crack occurs in the second recess 21 in a direction away from the first layer 13 caused by a load due to the anchor effect, this load can be released on the surface of the coating layer 5.

On the other hand, since the load caused by the anchor effect applied to the first recess 19 is relatively small, the crack is less likely to occur in the first recess 19 in a direction away from the second layer 15, in other words, in a direction toward the inside of the coated tool 1. As described above, since the crack hardly propagates deep, the durability of the coated tool 1 is high.

The coating layer 5 is not limited to the configuration including only the first layer 13 and the second layer 15, and may include a layer in addition to the first layer 13 and the second layer 15. For example, as shown in FIG. 3, the coating layer 5 may include a third layer 25 located between the base member 3 and the first layer 13 in addition to the first layer 13 and the second layer 15.

The third layer 25 includes a titanium compound in the example illustrated in FIG. 3. Examples of the titanium compound included in the third layer 25 include titanium carbide, nitride, oxide, carbonitride, carbon oxide and oxycarbonitride, as in the second layer 15.

The third layer 25 may be made into a single layer or, alternatively, may include a configuration in which a plurality of layers are laminated one another. For example, the third layer 25 may include a configuration in which a layer 25b located on the base member 3 side and including titanium nitride (TiN) and a layer 25a located on the first layer 13 side and including titanium carbonitride (TiCN) are sequentially located.

In a case where the third layer 25 includes the layer 25b including titanium nitride, the joinability between the base member 3 and the coating layer 5 is high. In a case where the third layer 25 includes the layer 25a including titanium carbonitride, the joinability between the third layer 25 and the first layer 13 is high.

Elemental analysis of the components included in each of the first layer 13, the second layer 15, and the third layer 25 can be evaluated, for example, by SEM-EDX using an energy dispersive X-ray spectrometer (EDX) attached to a scanning electron microscope or by a method using an electron probe microanalyzer (EPMA).

In the cross section orthogonal to the first surface 7, the numbers of the first projections 17 and the second projections 23 in the first layer 13 are not particularly limited, and each of them may be one or plural. In the cross section described above, when the first layer 13 includes a plurality of first projections 17, the joinability due to the anchor effect is high.

In addition, in the cross section orthogonal to the first surface 7, when a plurality of first recesses 19 are located on one first projection 17, the joinability between the first layer 13 and the second layer 15 is further high, and the durability of the first layer 13 and the second layer 15 is further high.

Since the first projection 17 is larger than the second projection 23, the anchor effect by one first projection 17 is larger than the anchor effect by one second projection 23. At this time, when the plurality of first recesses 19 are located on one first projection 17, the anchor effect by one second projection 23 with respect to the first projection 17 is high. Therefore, the joinability between the first layer 13 and the second layer 15 is further high, and the durability of the first layer 13 and the second layer 15 is further high.

The direction in which the first projection 17 and the second projection 23 protrude in the cross section orthogonal to the first surface 7 is not limited to a specific direction. As in the example illustrated in FIG. 4, when the direction in which the second projection 23 protrudes is inclined relative to the direction in which the first projection 17 protrudes, the load due to the anchor effect in the first projection 17 and the load due to the anchor effect in the second projection 23 are easily dispersed. Therefore, the durability of the coating layer 5 is high.

The direction in which the first projection 17 protrudes is a protrusion direction defined as the direction in which the line connecting the midpoint of the straight line connecting two base ends 17b and a front end 17a extends. Similarly, the direction in which the second projection 23 protrudes is a protrusion direction defined as the direction in which the line connecting the midpoint of the straight line connecting two base ends 23b and a front end 23a extends.

In the cross section orthogonal to the first surface 7, when the plurality of first recesses 19 are located on one first projection 17 as shown in the example of FIG. 4, at least one of the plurality of first recesses 19 may be depressed toward a direction away from the base member 3. In other words, at least one of the plurality of second projections 23 may protrude toward a direction away from the base member 3. When the second projection 23 protrudes in the above direction, even if a crack occurs in the first recess 19 caused by a load due to the anchor effect, the crack is easy to avoid from propagating toward the base member 3.

As in the example illustrated in FIGS. 4 and 5, the first layer 13 may include the plurality of columnar crystals 13a.

In the cross section orthogonal to the first surface 7, the base end 17b of the first projection 17 may be located at a boundary 13b between the columnar crystals 13a adjacent to one another as shown in FIG. 5. A relatively large load is likely to be applied to the base end 17b of the first projection 17. However, when the base end 17b of at least one first projection 17 is located at the location described above, the crack is less likely to propagate from the base end 17b of this first projection 17 toward the inside of the columnar crystal 13a. Therefore, the durability of the first layer 13 is high.

In the cross section orthogonal to the first surface 7, the front end 23a of at least one second projection 23 may be located at the boundary 13b between the columnar crystals 13a adjacent to one another. A relatively large load is likely to be applied to the bottom of the first recess 19 engaged to the front end 23a of the second projection 23. However, when the front end 23a of the second projection 23 is located at the location described above, the crack is less likely to propagate from the bottom of the first recess 19 toward the inside of the columnar crystal 13a. Therefore, the durability of the first layer 13 is high.

As in the example illustrated in FIG. 5, the direction in which the second projection 23 extends may be inclined relative to the direction in which the columnar crystal 13a extends (vertical direction in FIG. 5). When the second projection 23 protrudes as described above, the direction in which the first recess 19 engaged to the second projection 23 is depressed is inclined relative to the direction in which the columnar crystal 13a extends. In such a case, since the direction in which the load applied from the second projection 23 to the first recess 19 is applied is inclined relative to the direction in which the columnar crystals 13a extend, the crack is less likely to occur at the boundary 13b between the columnar crystals 13a adjacent to one another.

Examples of material of the base member 3 include inorganic materials, such as cemented carbide, cermet and ceramics. The material of the base member 3 is not limited to these materials.

Examples of composition of the cemented carbide include WC (tungsten carbide)-Co (cobalt), WC—TiC (titanium carbide)-Co, and WC—TiC—TaC (tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiCN, TiC, or TiN.

The base member 3 may include a through hole 27 that passes through the first surface 7 and a surface (the lower surface in FIG. 1) located on an opposite side of the first surface 7. The through hole 27 is usable for receiving a fixing member that fixes the coated tool 1 to a holder. Examples of the fixing member include a screw and a clamping member.

The size of the base member 3 is not particularly limited. For example, a length of one side of the first surface 7 may be set to approximately 3-20 mm. A height from the first surface 7 to the surface located on the opposite side of the first surface 7 may be set to approximately 5-20 mm.

<Manufacturing Method>

A method for manufacturing the coated tool 1 in the embodiment is described below.

Firstly, a mixed powder is manufactured by suitably adding metal powder, carbon powder or the like to inorganic powder selected from carbide, nitride, carbonitride and oxide or the like, which are capable of forming a hard alloy constituting the base member 3 by sintering, and then by mixing them together. Subsequently, a molded body is manufactured by molding the mixed powder into a predetermined tool shape with the use of a known molding method. Examples of the molding method include press molding, casting molding, extrusion molding and cold isostatic pressing. The base member 3 is manufactured by sintering the molded body in vacuum or a non-oxidizing atmosphere. A surface of the base member 3 may be then subjected to polishing process and honing process as needed.

Subsequently, the coating layer 5 is deposited on the surface of the base member 3 by chemical vapor deposition (CVD) method.

The first layer 13 can be formed by the following method. A first mixed gas is manufactured by blending 5-15 vol % of aluminum trichloride ($AlCl_3$) gas, 0.5-2.5 vol % of hydrogen chloride (HCl) gas, 0.5-5.0 vol % of carbon dioxide ($CO_2$) gas, and equal to or less than 1 vol % of hydrogen sulfide ($H_2S$) gas into hydrogen gas ($H_2$). This first mixed gas is introduced into the chamber under conditions of a deposition temperature of 950-1100° C. and a gas pressure of 5-20 kPa. In this manner, the first layer 13 in the coating layer 5 can be formed.

The second layer 15 can be formed by the following method. A second mixed gas is manufactured by blending 0.1-10 vol % of titanium tetrachloride ($TiCl_4$) gas and 10-60 vol % of nitrogen ($N_2$) gas into hydrogen gas. This second mixed gas is introduced into the chamber under conditions of a deposition temperature of 960-1100° C. and a gas pressure of 10-85 kPa. In this manner, the second layer 15 in the coating layer 5 can be formed.

At this time, for example, instead of continuously forming the second layer 15 after forming the first layer 13, the base member 3 covered with the first layer 13 is taken out of the chamber and the surface of the first layer 13 is processed. Thus, the first layer 13 including the first projection 17 and the first recess 19 can be formed. The surface processing described above is not limited to a specific processing but includes blast processing, laser processing, and etching processing.

Specifically, for example, when the first layer 13 is formed using the first mixed gas, the first projection 17 is formed, and blasting processing is performed by spraying particles including a particle diameter smaller than the height of the first projection 17 onto the surface of the first layer 13 including the first projection 17, thus the first recess 19 may be formed.

When the coating layer 5 includes the third layer 25 located between the base member 3 and the first layer 13, the third layer 25 can be formed by the following method.

First, a third mixed gas is manufactured by blending 0.5-10 vol % of titanium tetrachloride gas and 10-60 vol % of nitrogen gas into hydrogen gas. This third mixed gas is introduced into the chamber under conditions of a deposition temperature of 800-940° C. and a gas pressure of 8-50 kPa. In this manner, the layer 25b including titanium nitride in the third layer 25 can be formed.

A fourth mixed gas is manufactured by blending 0.5-10 vol % of titanium tetrachloride gas, 5-60 vol % of nitrogen gas, and 0.1-3 vol % of acetonitrile ($CH_3CN$) gas into hydrogen gas. This fourth mixed gas is introduced into the chamber under conditions of a deposition temperature of 780-880° C. and a gas pressure of 5-25 kPa. In this manner, the layer 25a including titanium carbonitride in the third layer 25 can be formed.

Thereafter, as needed, a polishing process is carried out on a part of the surface of the deposited coating layer 5 at which the cutting edge 11 is located. If the polishing process is carried out, a workpiece is less likely to be welded onto the cutting edge 11, thus leading to the coated tool 1 having excellent fracture resistance.

The above manufacturing method is one example of the method for manufacturing the coated tool 1 of the embodiment. Hence, the coated tools 1 are not limited to ones which are manufactured by the above manufacturing method.

<Cutting Tool>

A cutting tool 101 of the embodiment is described below with reference to the drawings.

Figure 6:
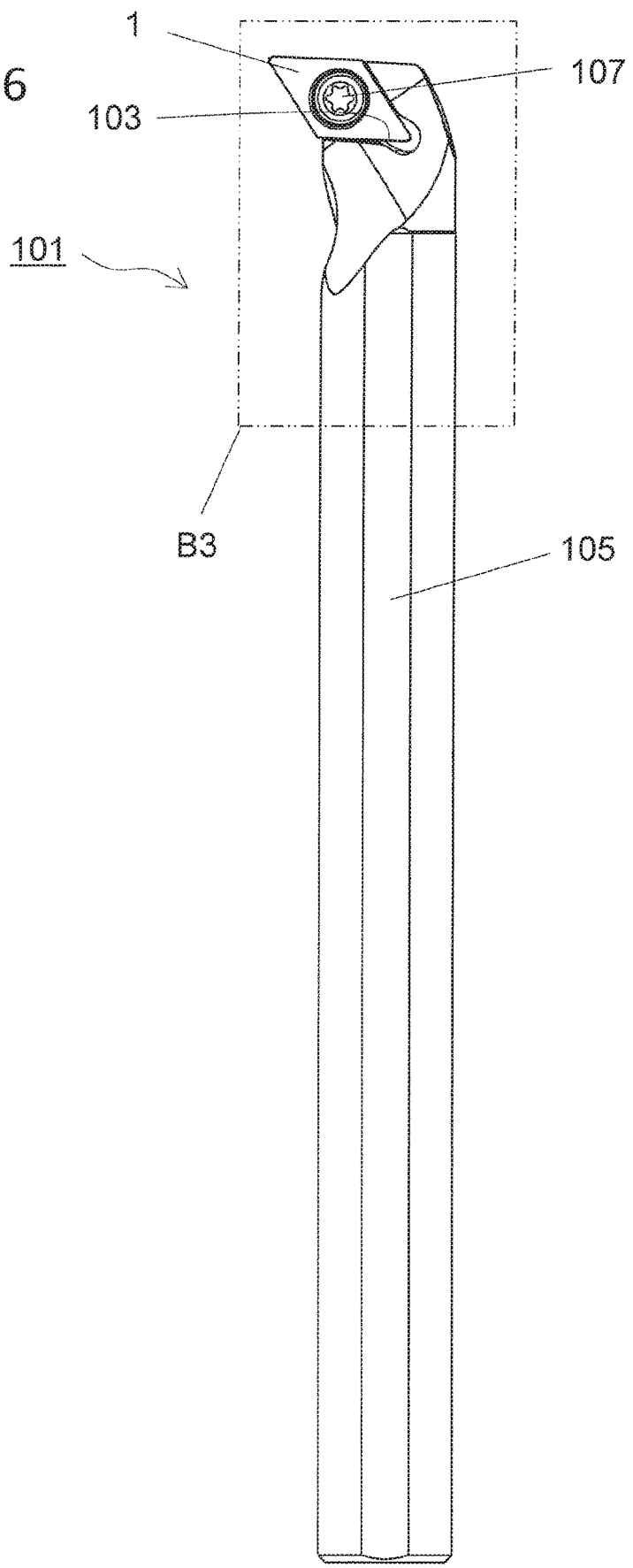
FIG. 6 is a plan view illustrating a cutting tool in the embodiment.
Figure 7:
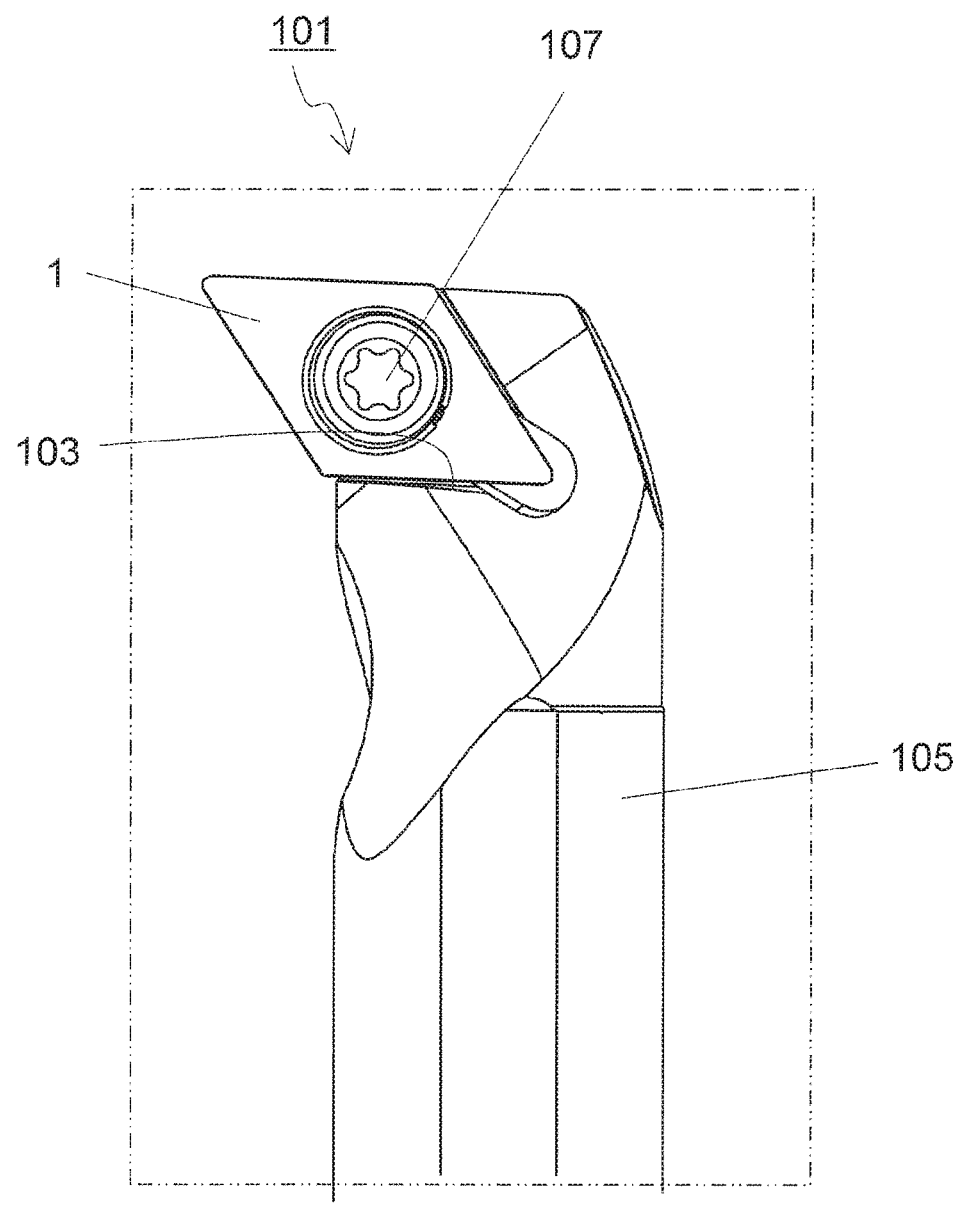
FIG. 7 is an enlarged view of a region B3 illustrated in FIG. 6.

The cutting tool 101 includes a bar-shaped body that extends from a first end (an upper end in FIG. 6) to a second end (a lower end in FIG. 6) in the example illustrated in FIGS. 6 and 7. The cutting tool 101 includes a holder 105 with a pocket 103 located at a side of the first end, and the coated tool 1 located at the pocket 103. In the cutting tool 101 of the example illustrated in FIGS. 6 and 7, the coated tool 1 is attached so that a part of the ridge line which is usable as a cutting edge is protruded from a front end of the holder 105.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A surface on the opposite side of the first surface in the coated tool 1 may be in a direct contact with the pocket 103. Alternatively, a sheet may be held between the coated tool 1 and the pocket 103.

The coated tool 1 is attached so that the part of the ridge line which is usable as the cutting edge is protruded outward from the holder 105. The coated tool 1 is attached to the holder 105 by a screw 107 in the example illustrated in FIGS. 6 and 7. Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as the holder 105. When steel is used among these members, the toughness of the holder 105 is high.

The embodiment has illustrated and described the cutting tools for use in the so-called turning process. Examples of the turning process include inner diameter processing, outer diameter processing and grooving process. The cutting tools are not limited to ones which are used for the turning process. For example, the coated tools 1 of the above embodiment are applicable to the cutting tools for use in the milling process.

<Method for Manufacturing Machined Product>

A method for manufacturing a machined product in the embodiment is described below with reference to the drawings.

The machined product is manufacturable by carrying out a cutting process of a workpiece 201. The method for manufacturing a machined product in the embodiment includes the following steps: (1) rotating the workpiece 201;

(2) bringing the cutting tool 101 represented by the above embodiment into contact with the workpiece 201 being rotated; and (3) moving the cutting tool 101 away from the workpiece 201.

Figure 8:
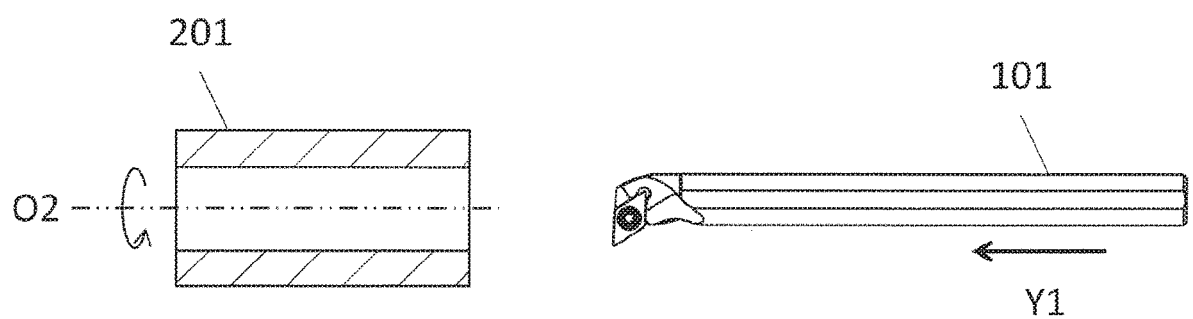
FIG. 8 is a schematic diagram illustrating a step in a method for manufacturing a machined product in the embodiment.
Figure 9:
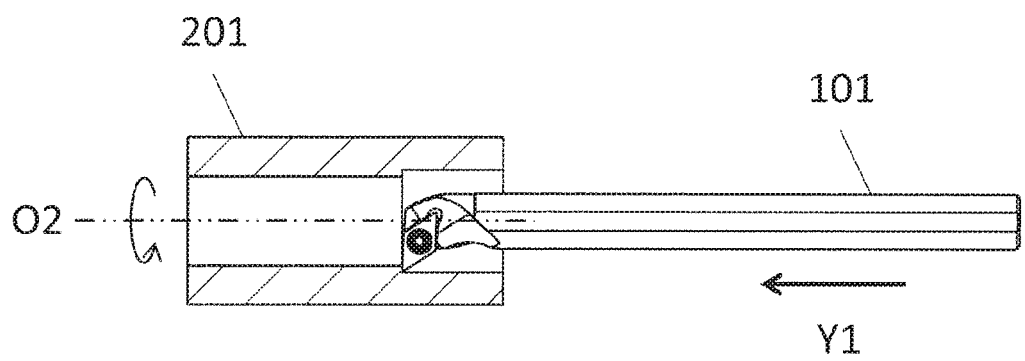
FIG. 9 is a schematic diagram illustrating a step in a method for manufacturing a machined product in the embodiment.
Figure 10:
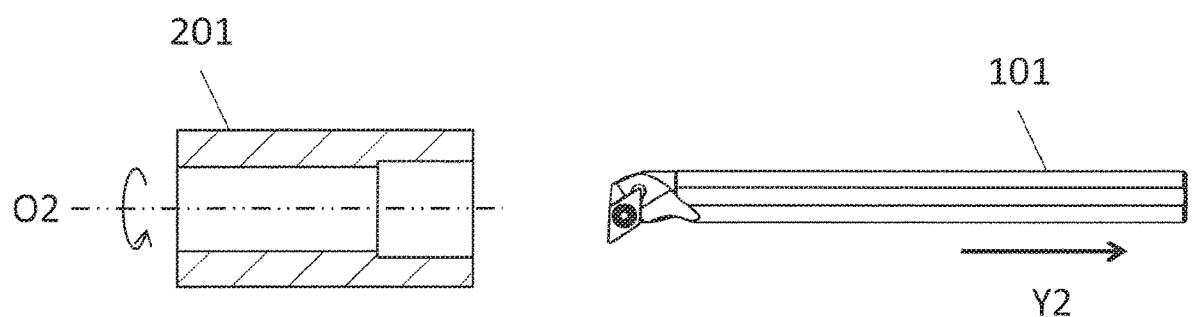
FIG. 10 is a schematic diagram illustrating a step in a method for manufacturing a machined product in the embodiment.

More specifically, firstly, the workpiece 201 is rotated around an axis O2, and the cutting tool 101 is relatively brought near the workpiece 201 as illustrated in FIG. 8. Then, the workpiece 201 is cut out by bringing the cutting edge in the cutting tool 101 into contact with the workpiece 201 as illustrated in FIG. 9. Thereafter, the cutting tool 101 is relatively moved away from the workpiece 201 as illustrated in FIG. 10.

In the example illustrated in FIG. 8, the cutting tool 101 is brought near the workpiece 201 by fixing the axis O2, and by moving the cutting tool 101 in Y1 direction in a state in which the workpiece 201 is rotated around the axis O2. In the example illustrated in FIG. 9, the workpiece 201 is cut out by bringing the cutting edge in an insert 1 into contact with the workpiece 201 being rotated. In the example illustrated in FIG. 10, the cutting tool 101 is moved away by being moved in Y2 direction in a state in which the workpiece 201 is rotated.

During the cutting process with the manufacturing method of the embodiment, the cutting tool 101 is brought into contact with the workpiece 201, or the cutting tool 101 is moved away from the workpiece 201 by moving the cutting tool 101 in each of the steps. However, there is no intention to limit to the above embodiment.

For example, the workpiece 201 may be brought near the cutting tool 101 in the step (1). Similarly, the workpiece 201 may be moved away from the cutting tool 101 in the step (3). When the cutting process is continued, it is necessary to repeat the step of bringing the cutting edge in the insert 1 into contact with different portions of the workpiece 201, while keeping the workpiece 201 rotated.

Representative examples of material of the workpiece 201 include carbon steel, alloy steel, stainless steel, cast iron, and nonferrous metals.

DESCRIPTION OF THE REFERENCE NUMERAL

1: Coated tool
3: Base member
5: Coating layer
7: First surface
9: Second surface
11: Cutting edge
13: First layer
13a: Columnar crystal
15: Second layer
17: First projection
17a: Front end
17b: Base end
19: First recess
21: Second recess
23: Second projection
23a: Front end
25: Third layer
27: Through hole
101: Cutting tool
103: Pocket
105: Holder
107: Fixing screw
201: Workpiece

What is claimed is:

1. A coated tool comprising:
a base member comprising:
a first surface; and
a coating layer located on the first surface;
wherein the coating layer comprises a first layer comprising an aluminum oxide; wherein the coating layer further comprises a second layer located on the first layer; and wherein the second layer comprises a titanium compound,
with the first layer disposed closer to the base member than the second layer; and
wherein the first layer comprises a first projection protruding toward the second layer and one or more first recesses located on the first projection, and wherein the second layer comprises a second recess engaged with the first projection and a second projection engaged with a single recess of the one or more first recesses in a cross section orthogonal to the first surface.

2. The coated tool according to claim 1, wherein the one or more first recesses is a plurality of the first recesses located on the first projection in the cross section orthogonal to the first surface.

3. The coated tool according to claim 1, wherein a direction in which the second projection protrudes is inclined relative to a direction in which the first projection protrudes in the cross section orthogonal to the first surface.

4. The coated tool according to claim 3, wherein
the one or more first recesses is a plurality of the first recesses located on the first projection in the cross section orthogonal to the first surface, and
at least one of the plurality of the first recesses is depressed toward a direction away from the base member.

5. The coated tool according to claim 1, wherein
the first layer further comprises a plurality of columnar crystals individually extending from a side of the base member toward the second layer, and
a base end of the first projection is located at a boundary between the columnar crystals adjacent to one another in the cross section orthogonal to the first surface.

6. The coated tool according to claim 1, wherein
the first layer further comprises a plurality of columnar crystals individually extending from a side of the base member toward the second layer, and
a front end of the second projection is located at a boundary between the columnar crystals adjacent to one another in the cross section orthogonal to the first surface.

7. The coated tool according to claim 6, wherein a direction in which the second projection whose front end is located at a boundary between the columnar crystals adjacent to one another is inclined relative to a direction in which the columnar crystals extend.

8. A cutting tool, comprising:
a holder comprising a pocket located at a front end side; and
the coated tool according to claim 1, which is located at the pocket.

9. A method for manufacturing a machined product, comprising:
rotating the cutting tool according to claim 8;
bringing the cutting tool being rotated into contact with a workpiece; and
moving the cutting tool away from the workpiece.

10. A coated tool comprising:
a base member comprising:
a first surface that is an outermost surface of the base member; and
a coating layer located on the first surface;
wherein the coating layer comprises a first layer comprising an aluminum oxide; wherein the coating layer further comprises a second layer located on an outermost surface of the first layer; and wherein the second layer comprises a titanium compound, with an outermost surface of the second layer located further away from the base member than the outermost surface of the first layer; and wherein the outermost surface of the first layer comprises a first projection protruding toward the second layer and one or more first recesses located on the first projection, and wherein the second layer comprises a second recess engaged with the first projection and a second projection engaged with a single recess of the one or more first recesses in a cross section orthogonal to the first surface.

11. The coated tool according to claim 10, wherein the one or more first recesses is a plurality of the first recesses located on the first projection in the cross section orthogonal to the first surface.

12. The coated tool according to claim 10, wherein a direction in which the second projection protrudes is inclined relative to a direction in which the first projection protrudes in the cross section orthogonal to the first surface.

13. The coated tool according to claim 12, wherein the one or more first recesses is a plurality of the first recesses located on the first projection in the cross section orthogonal to the first surface, and at least one of the plurality of the first recesses is depressed toward a direction away from the base member.

14. The coated tool according to claim 10, wherein the first layer further comprises a plurality of columnar crystals individually extending from a side of the base member toward the second layer, and a base end of the first projection is located at a boundary between the columnar crystals adjacent to one another in the cross section orthogonal to the first surface.

15. The coated tool according to claim 10, wherein the first layer further comprises a plurality of columnar crystals individually extending from a side of the base member toward the second layer, and a front end of the second projection is located at a boundary between the columnar crystals adjacent to one another in the cross section orthogonal to the first surface.

16. The coated tool according to claim 15, wherein a direction in which the second projection whose front end is located at a boundary between the columnar crystals adjacent to one another is inclined relative to a direction in which the columnar crystals extend.

17. A cutting tool, comprising:

a holder comprising a pocket located at a front end side; and the coated tool according to claim 10, which is located at the pocket.

18. A method for manufacturing a machined product, comprising:

rotating the cutting tool according to claim 17;

bringing the cutting tool being rotated into contact with a workpiece; and moving the cutting tool away from the workpiece.

* * * * *